US012757387B2

(12) United States Patent
Tsai

(10) Patent No.: US 12,757,387 B2
(45) Date of Patent: Oct. 6, 2026

(54) SEMICONDUCTOR DEVICE AND MANUFACTURING METHOD THEREOF

(71) Applicant: NANYA TECHNOLOGY CORPORATION, New Taipei City (TW)

(72) Inventor: Jhen-Yu Tsai, Kaohsiung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 494 days.

(21) Appl. No.: 18/177,102

(22) Filed: Mar. 1, 2023

(65) Prior Publication Data

US 2024/0298437 A1 Sep. 5, 2024

(51) Int. Cl.
*H10B 12/00* (2023.01)

(52) U.S. Cl.
CPC ......... *H10B 12/488* (2023.02); *H10B 12/053* (2023.02); *H10B 12/315* (2023.02); *H10B 12/34* (2023.02)

(58) Field of Classification Search
CPC .... H10B 12/053; H10B 12/315; H10B 12/34; H10B 12/488
See application file for complete search history.

(56) References Cited

U.S. PATENT DOCUMENTS

2019/0067278 A1 2/2019 Seo et al.
2023/0038881 A1 * 2/2023 Kim .................... H10D 64/513

FOREIGN PATENT DOCUMENTS

CN 109285833 A 1/2019

* cited by examiner

*Primary Examiner* — Meiya Li

(74) *Attorney, Agent, or Firm* — CKC & Partners Co., LLC

(57) ABSTRACT

A semiconductor device includes a substrate, a first word line, a barrier layer, a first insulating layer and a second insulating layer. The first word line is in the substrate. The barrier layer cups an underside of the first word line. The first insulating layer extends along a top surface of the first word line and is laterally surrounded by the barrier layer. The second insulating layer is on the first insulating layer and laterally surrounded by the barrier layer. The second insulating layer has a material different from a material of the first insulating layer.

9 Claims, 17 Drawing Sheets

SEMICONDUCTOR DEVICE AND MANUFACTURING METHOD THEREOF

BACKGROUND

Field of Invention

The present disclosure relates to semiconductor device and manufacturing method thereof. More particularly, the present disclosure relates to first insulating layer on word lines of semiconductor device.

Description of Related Art

Semiconductor devices, such as memory devices, Dynamic Random Access Memory (DRAM) for storage of information, or others, are currently in widespread use, in a myriad of applications. The DRAM include a plurality of DRAM cells, each of which includes a capacitor for storing information and a transistor coupled to the capacitor for regulating the timing of when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL when the WL is asserted.

In a predictive failure analysis (PFA), the word lines may include abnormal heights therebetween. The abnormal heights influences the gate induced drain leakage (GIDL) and may lead to electrical variation issues.

SUMMARY

One aspect of the present disclosure is a semiconductor device. According to some embodiments of the present disclosure, a semiconductor device includes a semiconductor device includes a substrate, a first word line, a barrier layer, a first insulating layer and a second insulating layer. The first word line is in the substrate. The barrier layer cups an underside of the first word line. The first insulating layer extends along a top surface of the first word line and is laterally surrounded by the barrier layer. The second insulating layer is on the first insulating layer and laterally surrounded by the barrier layer. The second insulating layer has a material different from a material of the first insulating layer.

In some embodiments, the first insulating layer cupping an underside of the second insulating layer.

In some embodiments, the first insulating layer extends along an inner sidewall of the barrier layer.

In some embodiments, the barrier layer and the first insulating layer include the same material.

In some embodiments, the semiconductor device further comprises a second word line in the substrate. The second word line has a height different from a height of the first word line.

In some embodiments, the semiconductor device further comprises a third insulating layer extending along a top surface of the second word line.

In some embodiments, the third insulating layer and the barrier layer include the same material.

In some embodiments, the third insulating layer has a U-shape in a cross section.

In some embodiments, the third insulating layer comprises silicon nitride.

In some embodiments, the first insulating layer comprises silicon oxide.

One aspect of the present disclosure is a manufacturing method of semiconductor device. According to some embodiments of the present disclosure, the method comprises the following steps. A substrate is etched to form a plurality of trenches in the substrate. A barrier layer is conformally formed in the plurality of trenches and on the substrate. A conductive material is formed in the plurality of trenches. A silicon-containing material is formed on the conductive material. A first insulating layer is formed extending along a top surface of the silicon-containing material. A second insulating layer is formed on the first insulating layer. The second insulating layer has a material different from a material of the first insulating layer.

In some embodiments, forming the first insulating layer comprises oxidizing the silicon-containing material.

In some embodiments, forming the first insulating layer comprises performing an atomic layer deposition process to form the first insulating layer such that the first insulating layer extends along an inner sidewall of the barrier layer.

In some embodiments, the method further comprises prior to forming the first insulating layer, performing an etch process to recess the silicon-containing material on the conductive material in a first one of the plurality of trenches.

In some embodiments, the etch process is performed such that the barrier layer has a reduced thickness.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
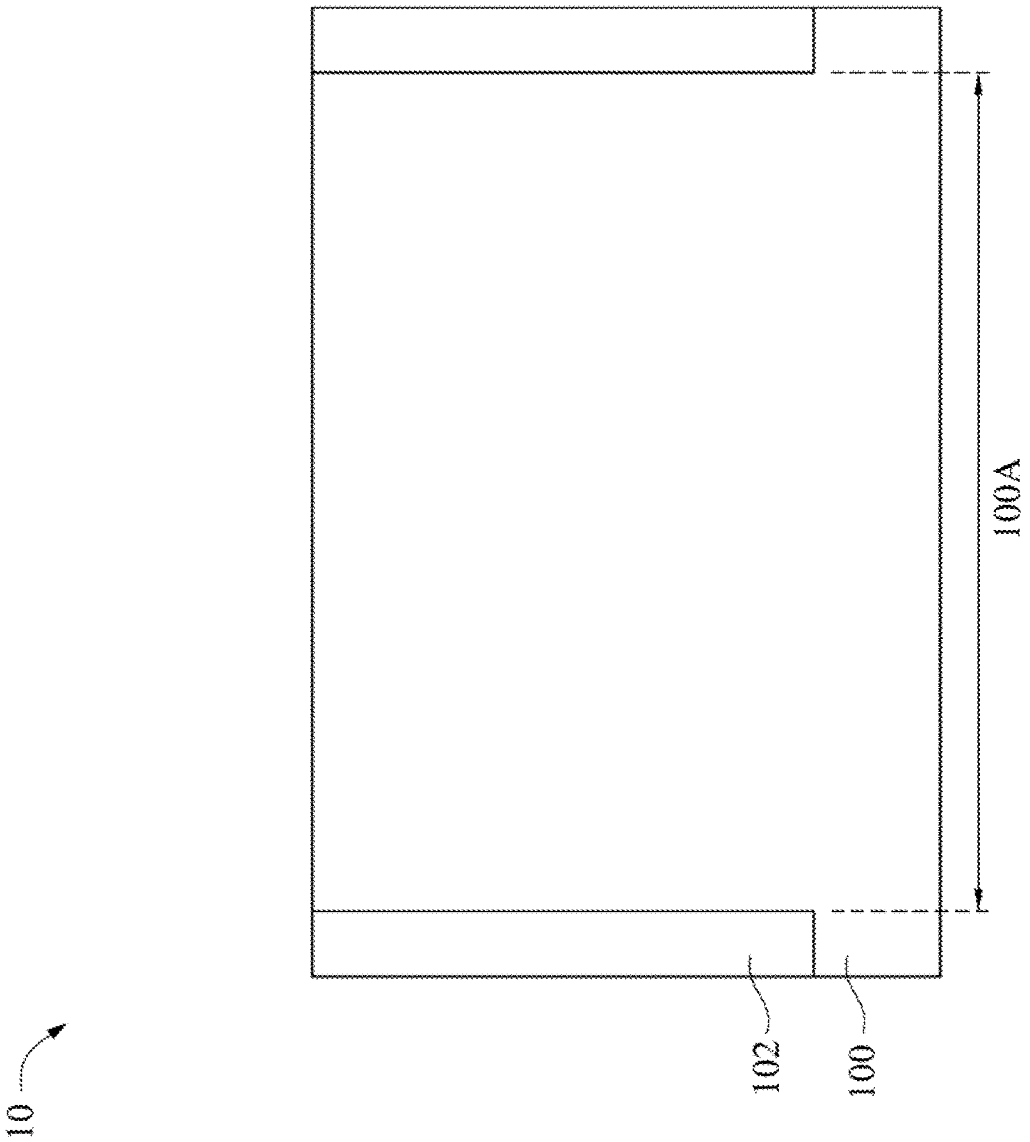
FIGS. 1, 2, 3, 4, 5, 6A, 6B, 6C, 7, 8A, 8B, 8C and 8D are cross-sectional views of a semiconductor device in accordance with some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

FIGS. 1, 2, 3, 4, 5, 6A, 6B, 6C, 7 and 8A are cross-sectional views of a semiconductor device 10 in accordance with some embodiments of the present disclosure. Reference is made to FIG. 1. In some embodiments, the semiconductor device 10 is a memory integrated circuit (IC) or a memory device. The semiconductor device 10 includes a substrate 100. The substrate 100 may include a silicon-containing material. Examples of silicon-containing materials suitable for the substrate 100 may include, but are not limited to, silicon, silicon germanium, carbon doped silicon germanium, silicon germanium carbide, carbon-doped silicon, silicon carbide, and multi-layers thereof.

In some embodiments, the substrate 100 may include a semiconductor-on-insulator structure which consisting of, from bottom to top, a handle substrate, an insulator layer, and a topmost semiconductor material layer. The handle substrate and the topmost semiconductor material layer may be formed of a same material such as bulk silicon, or other suitable semiconductor material. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride.

An isolation region 102 may be formed in the substrate 100 to define an active area 100A. For example, a series of deposition processes may be performed to deposit a pad oxide layer (not shown for clarity) and a pad nitride layer (not shown for clarity) on the substrate 100. A photolithography process may be performed to define the position of the isolation region 102. After the photolithography process, an etch process, such as an anisotropic dry etch process, may be performed to form trenches penetrating through the pad oxide layer, the pad nitride layer, and the substrate 100. An insulating material may be deposited into the trenches and a planarization process, such as chemical mechanical polishing, may be subsequently performed to remove excess filling material until the substrate 100 is exposed. The insulating material may be, for example, silicon oxide, silicon nitride, silicon oxynitride, silicon nitride oxide, the like, or a combination thereof. For brevity, clarity, and convenience of description, only one active area 100A is described.

Figure 2:
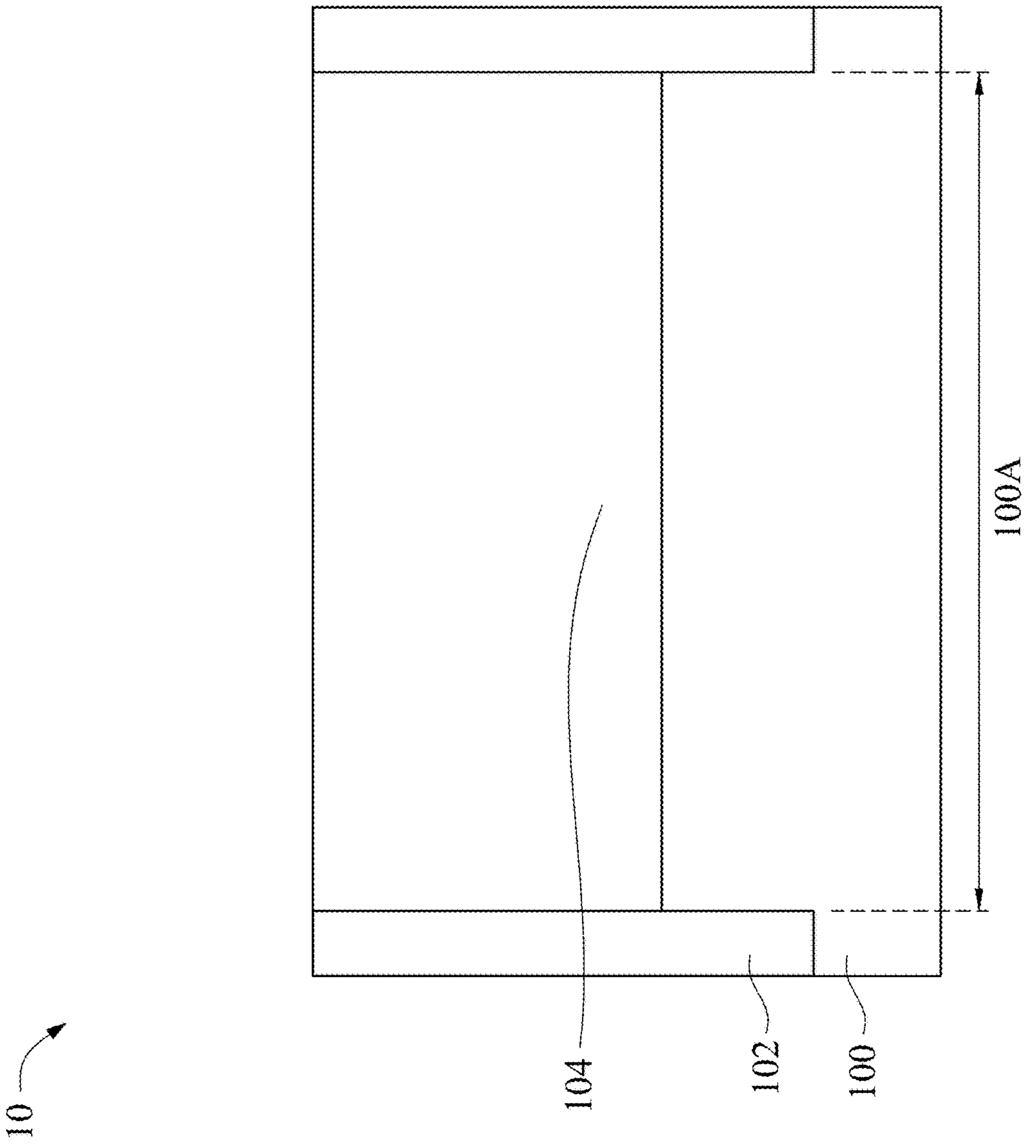

Reference is made to FIG. 2. A doped region 104 may be formed in the active area 100A. The doped region 104 may be formed by an n-type impurity or a p-type impurity implantation process. The n-type impurity implantation process may add impurities that contribute free electrons to an intrinsic semiconductor. In a silicon-containing substrate, examples of n-type dopants, i.e., impurities, include but are not limited to antimony, arsenic, or phosphorous. The p-type impurity implantation process may add impurities to an intrinsic semiconductor that creates deficiencies of valence electrons. In a silicon-containing substrate, examples of p-type dopants, i.e., impurities include but are not limited to boron, aluminum, gallium, or indium. In some embodiments, an annealing process may be performed to activate the doped region 104.

Figure 3:
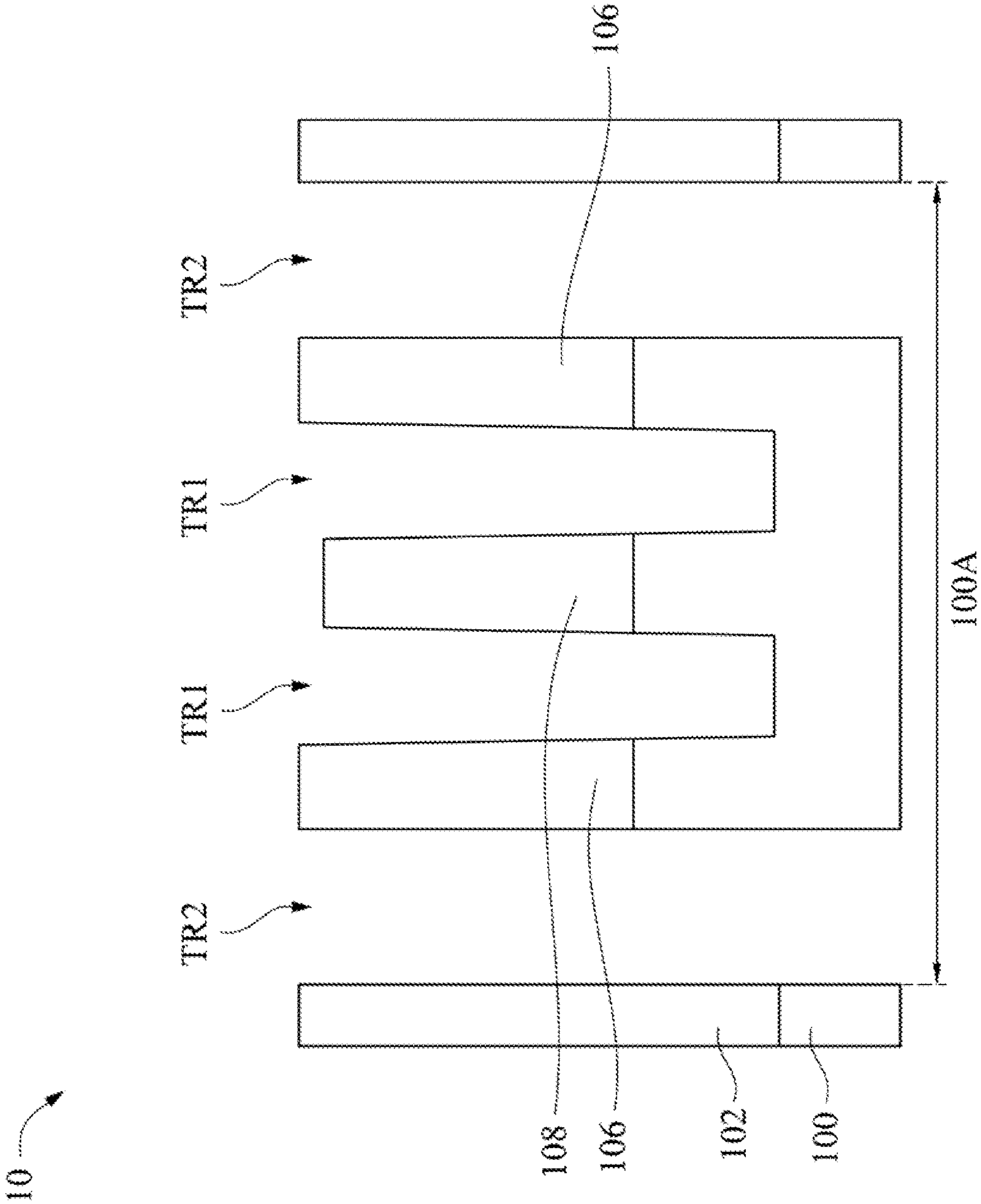

Reference is made to FIG. 3. A mask layer (not shown) may be formed on the substrate 100 and the isolation region 102. A photolithography process may be performed to define the position of a plurality of first word line trenches TR1 and a plurality of second word line trenches TR2. An etch process, such as an anisotropic dry etch process, may be performed to remove the substrate 100 and the doped region 104, forming the first word line trenches TR1 and the second word line trenches TR2. The first word line trenches TR1 may divide the doped region 104 into two drain regions 106 and a source region 108 positioned between the two drain regions 106.

Figure 4:
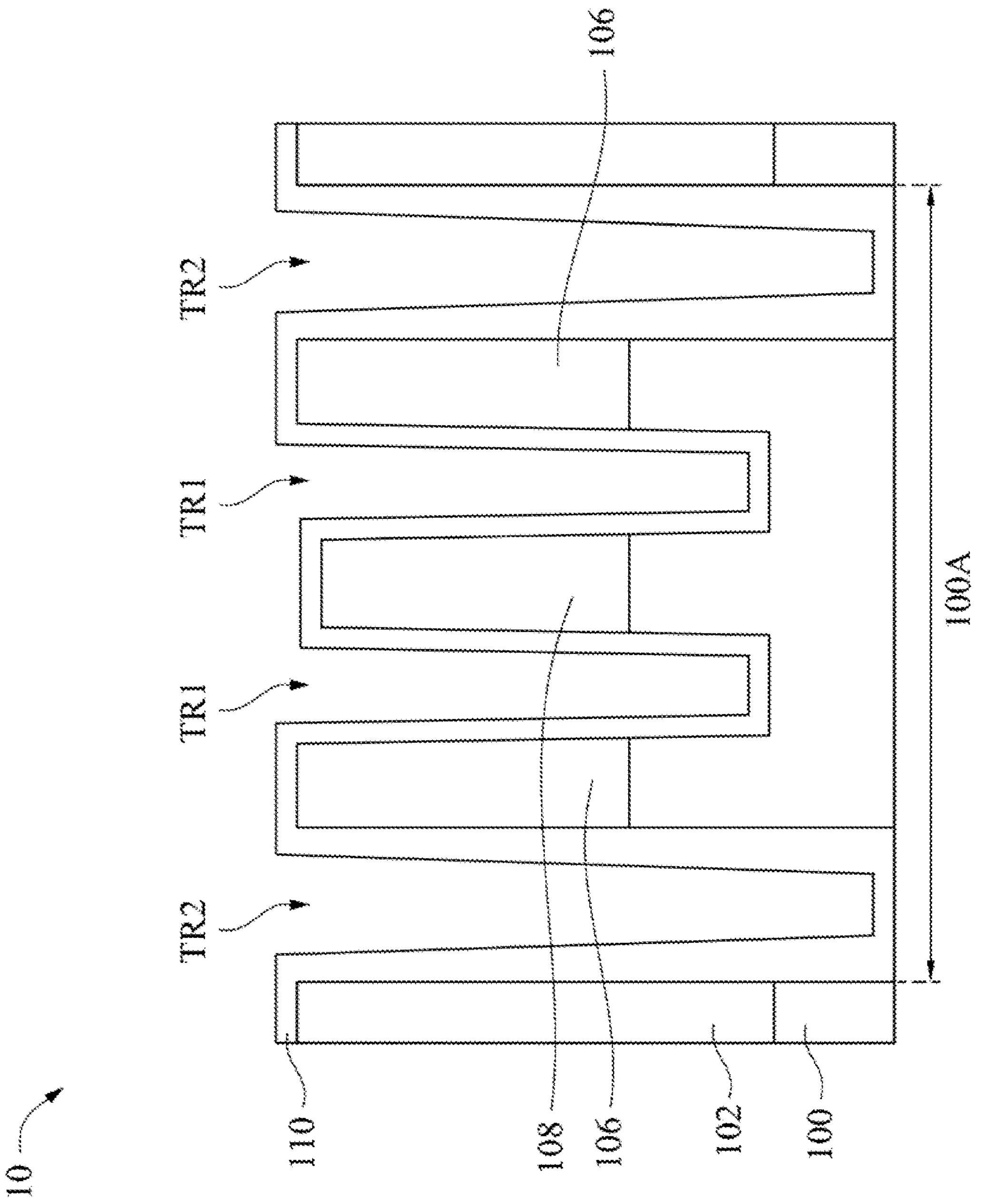

Reference is made to FIG. 4. A barrier layer 110 is conformally formed on sidewalls and bottom surfaces of the first word line trenches TR1 and the second word line trenches TR2. The barrier layer 110 may be formed using a process such as chemical vapor deposition (CVD), physical vapor deposition (PVD), plasma enhanced CVD (PECVD), plasma enhanced physical vapor deposition (PEPVD), atomic layer deposition (ALD), or the like. The barrier layer 110 may include an insulating material, such as an oxide layer. In some embodiments, the barrier layer 110 includes silicon oxide.

Figure 5:
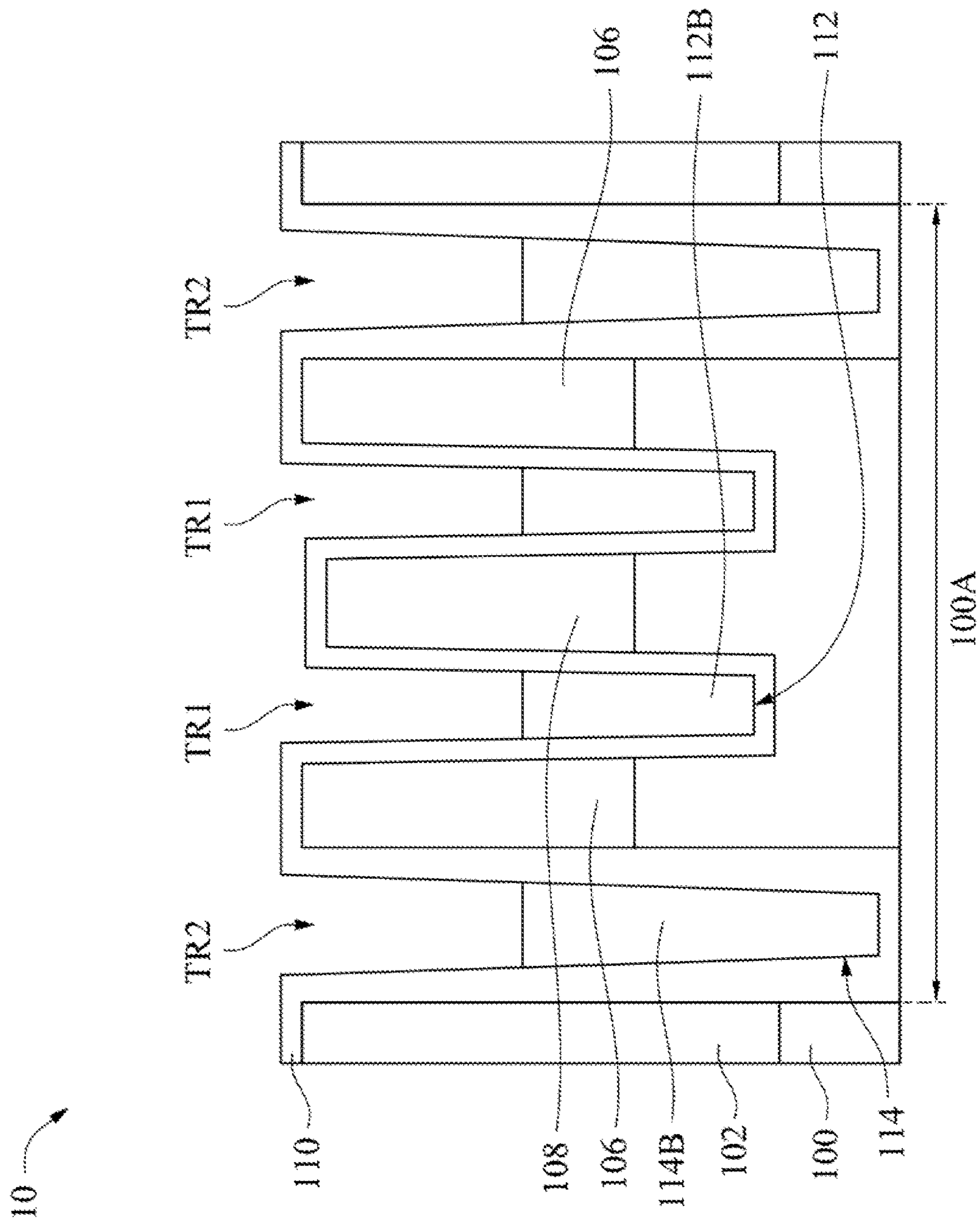

Referring to FIG. 5, a conductive material is formed over the barrier layer 110, filling into the first word line trenches TR1 and the second word line trenches TR2. In some embodiments, the conductive material includes metal, such as tungsten. An etch process may be performed to the conductive material using the CMP process, an etch back process, or a combination thereof, forming bottom portions 112B of the first word lines 112 (see FIG. 6A) and bottom portions 114B of the second word lines 114. The top surface of the bottom portions 112B of the first word lines 112 and the top surface of the bottom portion 114B of the second word lines 114 are lower than the top surface of the isolation region 102 and the top surface of the barrier layer 110.

Figure 6A:
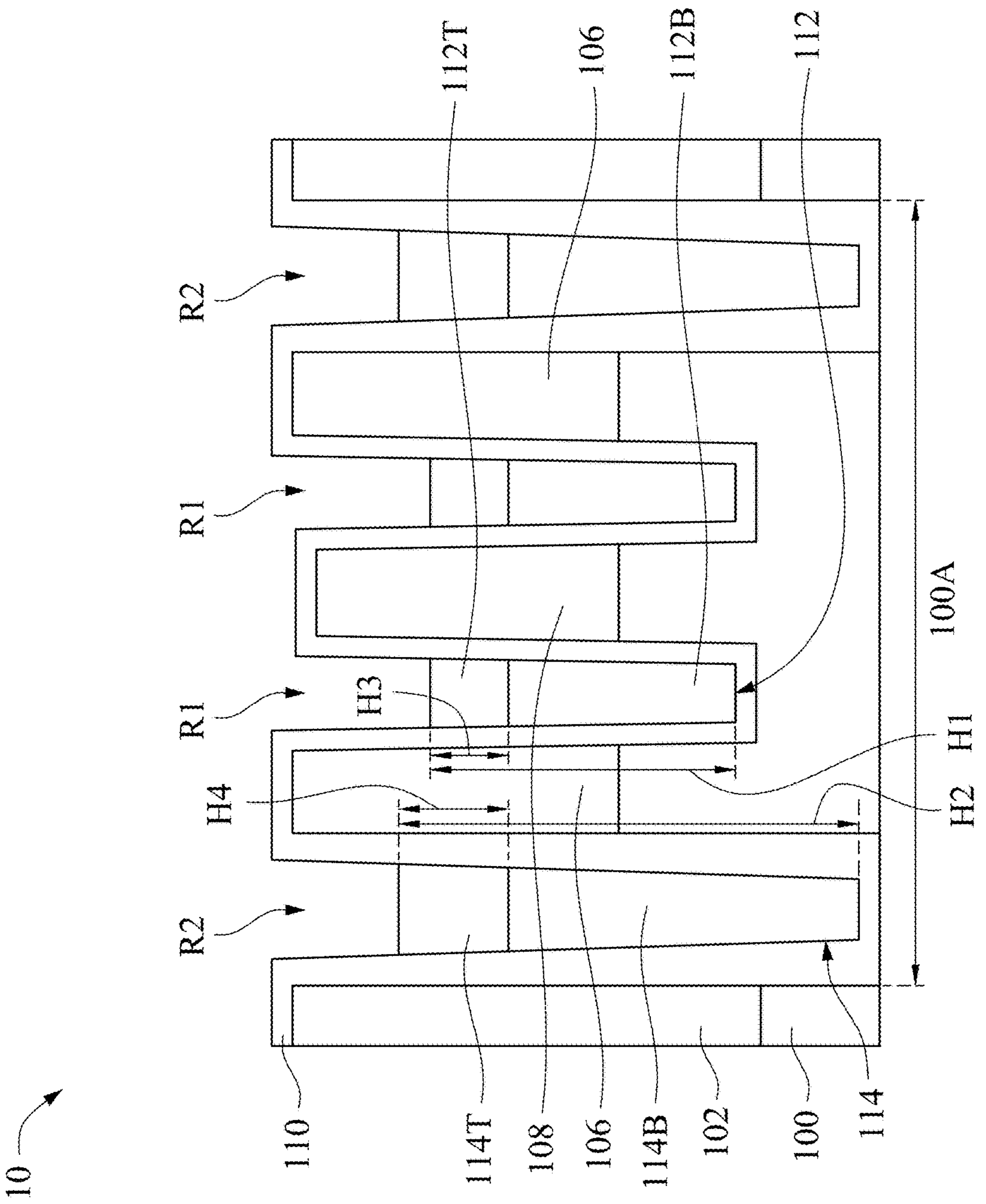

Referring to FIG. 6A, a semiconductor material is formed on the isolation region 102, the bottom portions 112B of the first word lines 112 and the bottom portions 114B of the second word lines 114. The semiconductor material has a material different from the material of the bottom portions 112B, 114B. In some embodiments, the semiconductor material includes polysilicon. An etch process may be performed to the semiconductor material using CMP process, an etch back process, or a combination thereof, forming top portions 112T of the first word lines 112 and top portions 114T of the second word lines 114. In some embodiments, the top portions 112T are recessed to form a recess R1 on the top portions 112T using an etch back process. The top portions 114T are recessed to form a recess R2 on the top portions 114T using an etch back process. The top surface of the top portions 112T of the first word lines 112 and the top surface of the top portions 114T of the second word lines 114 are lower than the top surfaces of the isolation region 102 and the barrier layer 110. The first word lines 112 and the second word lines 114 are thus formed.

The first word lines 112 and the second word lines 114 each has a multi-layer structure. The top portions 112T, 114T include silicon-containing material, and the bottom portions 112B, 114B include metal. In some embodiments, the top portions 112T, 114T includes polysilicon, and the bottom portions 112B, 114B includes tungsten.

In some embodiments, after performing the planarization to the semiconductor material using the CMP process or the etch back process, the second word lines 114 has a height H2 different from a height H1 of the first word lines 112. For example, the height H2 is greater than the height H1. That is, the second word lines 114 have a top surface higher than a top surface of the first word lines 112. That is, the top portions 114T of the second word lines 114 have a height H4 greater than a height H3 of the top portions 112T of the first word lines 112. If the height H2 of the second word lines 114 is different from the height H1 of the first word lines 112, it is judged that the one of the respective changes of the heights of the first word lines 112 and the second word lines 114 is abnormal.

Figure 6B:
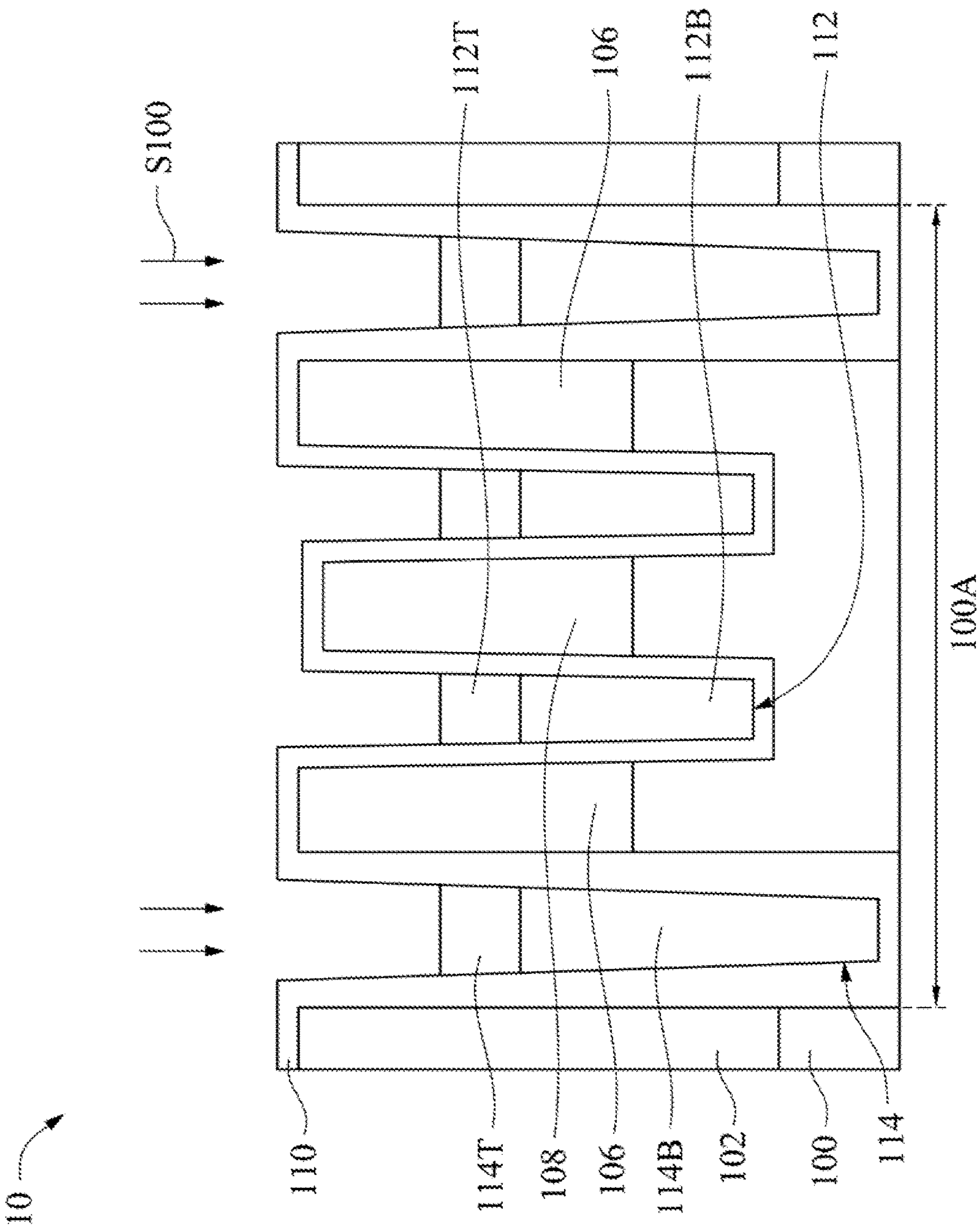

Reference is made to FIG. 6B. In some embodiments, prior to forming a subsequent first insulating layer, an etch process S100 is performed to recess the second word lines 114. In other words, the etch process S100 is performed to recess the top portions 114T of the second word lines 114 such that the top surface of the first word lines 112 is substantially level with the top surface of the second word lines 114. In some embodiments, a mask (not shown) is formed on the first word lines 112 to protect the first word lines 112 from being recessed during the etch process S100.

Figure 6C:
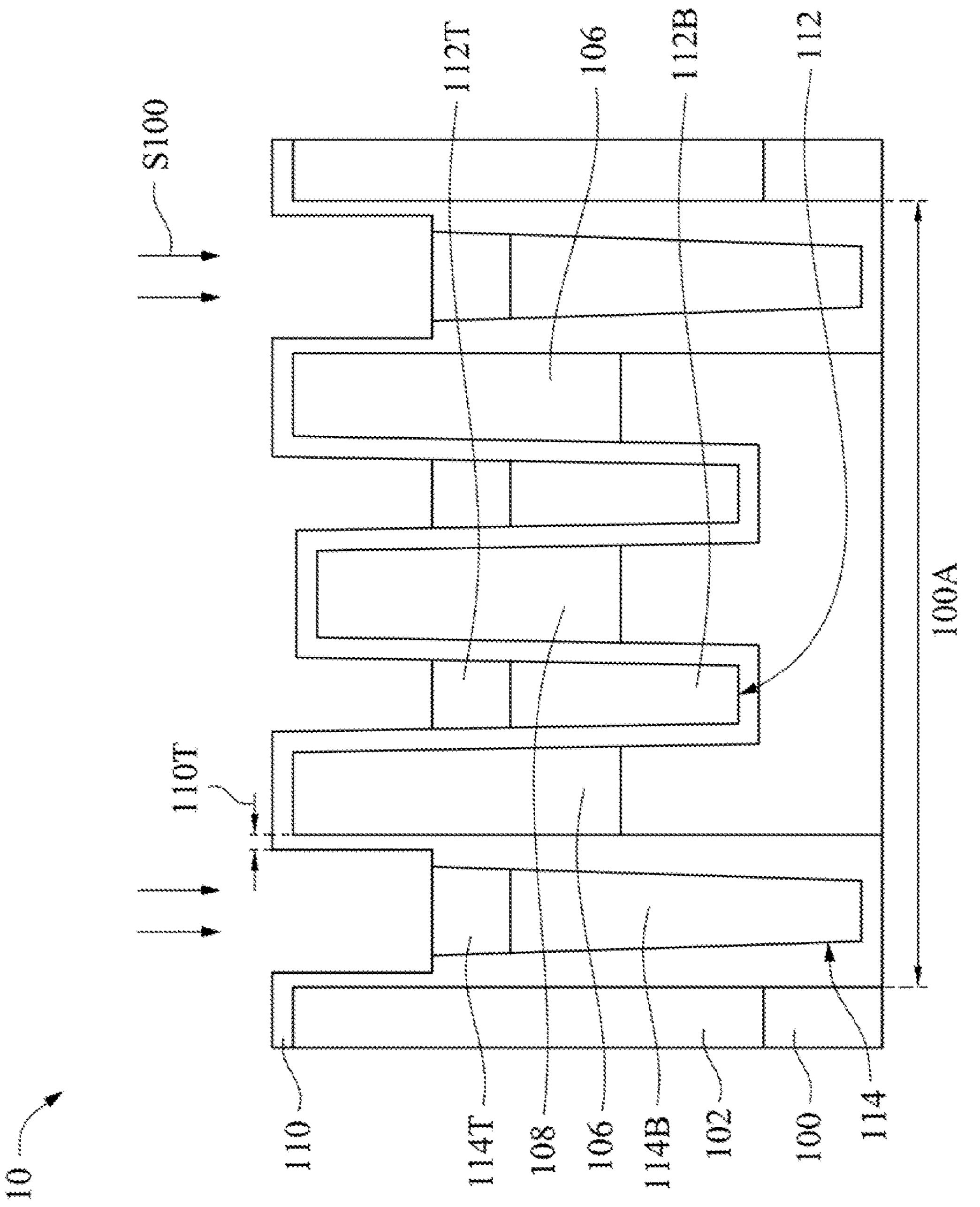

In some embodiments, the etch process S100 may be an anisotropic etch process, such as plasma etch. In FIG. 6C, in some embodiments, the etch process S100 is performed such that the barrier layer 110 has a reduced thickness 110T.

Figure 7:
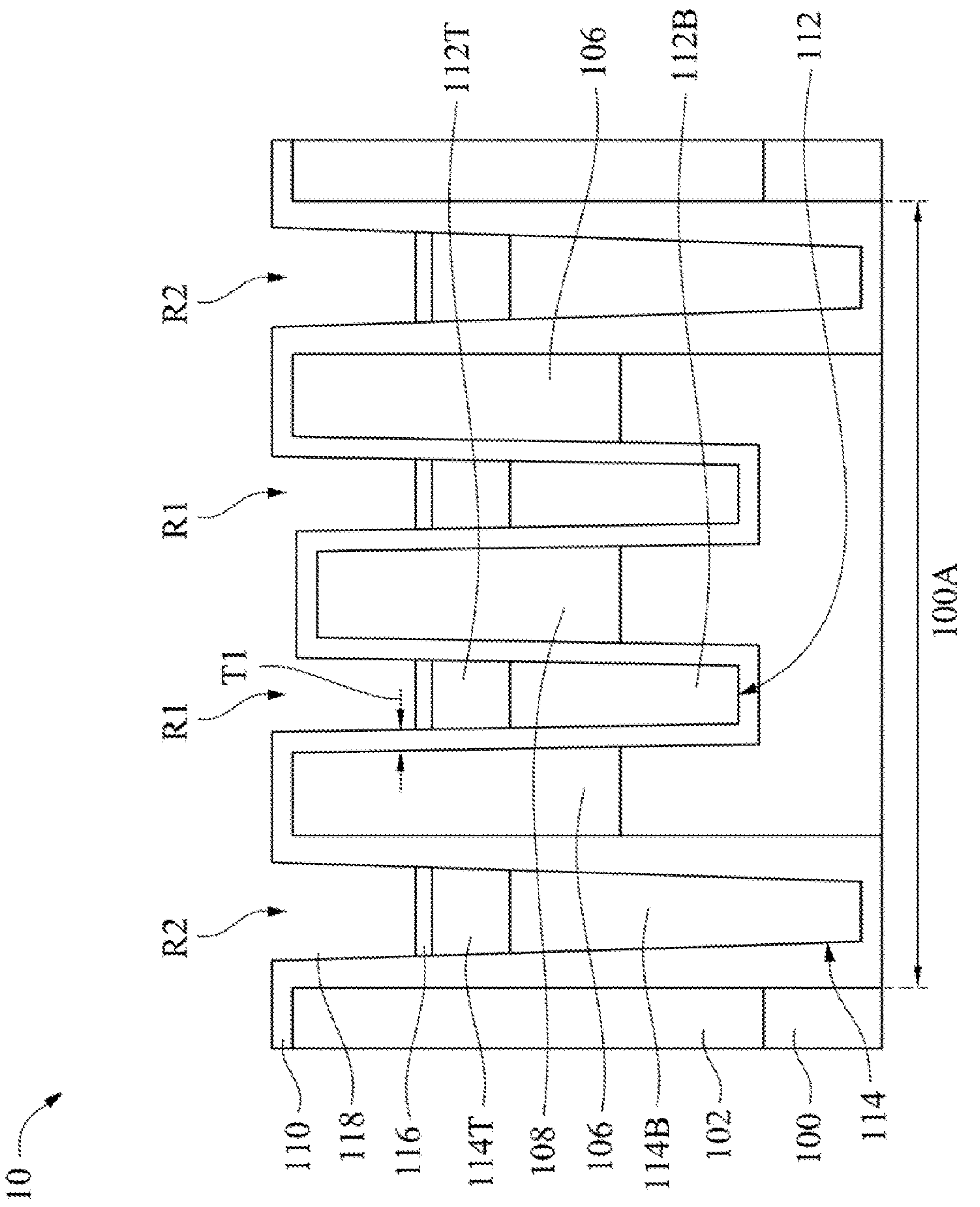

Referring to FIG. 7, a first insulating layer 116 is formed over the top portions 112T of the first word lines 112 and the top portions 114T of the second word lines 114. The first insulating layer 116 extends along a top surface of the first word lines 112, a top surface of the second word lines 114 and is laterally surrounded by the barrier layer 110. The first insulating layer 116 may include an insulating material, such as an oxide layer. In some embodiments, the first insulating layer 116 is formed by oxidizing the top portions 112T of the first word lines 112 and the top portions 114T of the second word lines 114 using an oxidization process. In some examples, the oxidation process may be performed by exposing the semiconductor device 10 to a wet oxidation process, a dry oxidation process, or a combination thereof. In some embodiments, the semiconductor device 10 is exposed to a wet oxidation process using water vapor or steam as the oxidant. The first insulating layer 116 is an oxide layer. In some embodiments where the top portions 112T of the first word lines 112 and the top portions 114T of the second word lines 114 are polysilicon, the first insulating layer 116 is silicon oxide. In some embodiments, the first insulating layer 116 has a thickness T2 substantially the same as a thickness T1 of the barrier layer 110.

In some embodiments, the barrier layer 110 and the first insulating layer 116 include the same material, such as silicon oxide. The first insulating layer 116 is configured to mitigate gate induced drain leakage (GIDL) of the semiconductor device 10. In some embodiments, the first insulating layer 116 reduces the GIDL by compensating for loss of the barrier layer 110 during the over etching of the top portion 114T of the second word line 114 caused by the etch process S100 (see FIG. 6C).

Figure 8A:
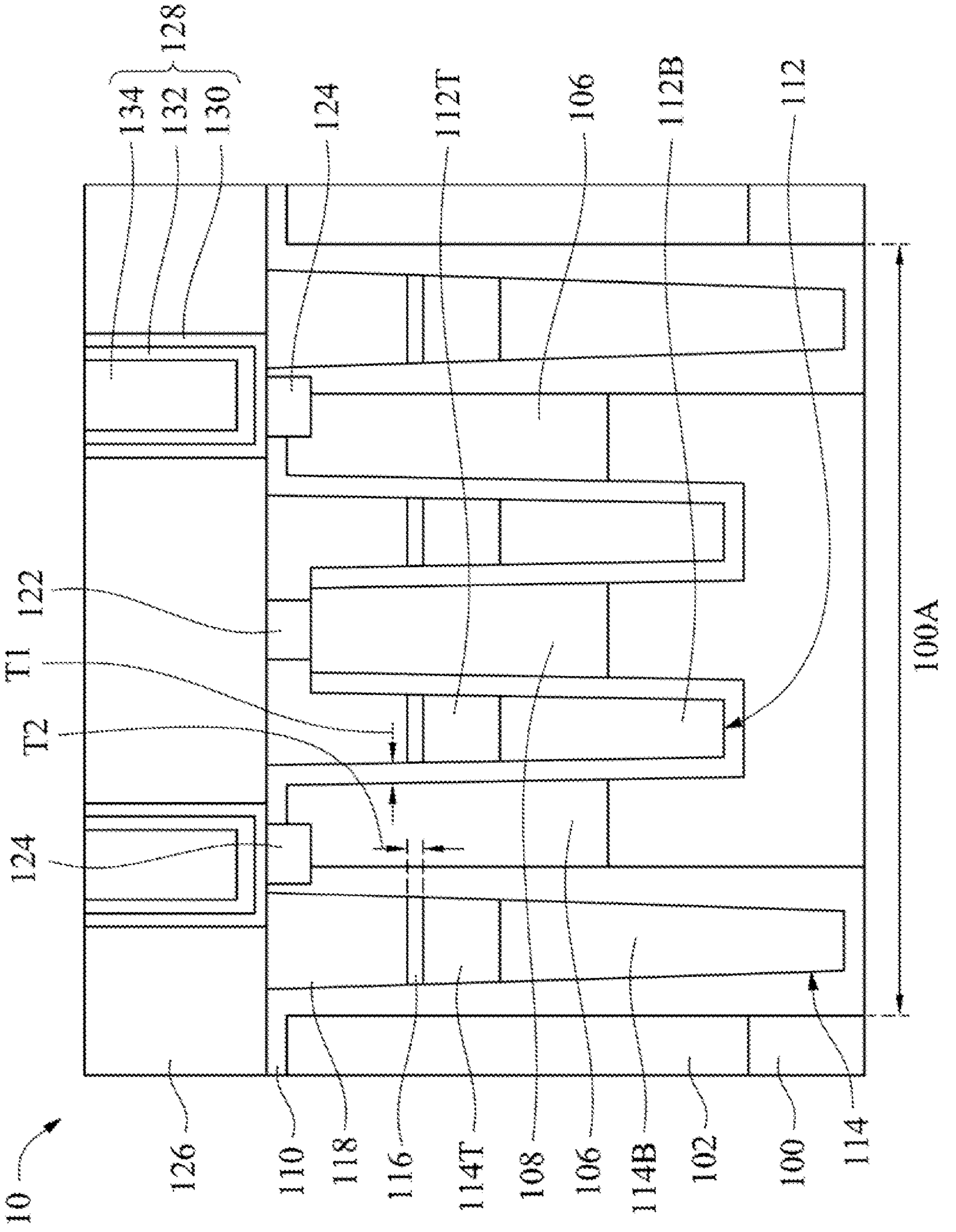

Referring to FIG. 8A, a second insulating layer 118 is formed on the first insulating layer 116 and the isolation region 102, filling into the recess R1 and the recess R2 (see FIG. 7). The first insulating layer 116 is between the first word lines 112 and the second insulating layer 118 and is between the second word lines and the second insulating layer 118. The second insulating layer 118 has a material different from a material of the first insulating layer 116. The second insulating layer 118 may be a multi-layer stack or a single layer. In some embodiment, the second insulating layer 118 may include a dielectric layer such as silicon nitride layer, silicon oxynitride layer, or the like.

The second insulating layer 118 is then planarized, for example, by a CMP process. The CMP process is performed to remove excess material of the second insulating layer 118 to planarize a top surface of the semiconductor device 10. The second insulating layer 118 extends along the top surface of the first word lines 112, the top surfaces of the second word lines 114, and is laterally surrounded by the barrier layer 110.

A first conductive contact 122 is formed in the second insulating layer 118, and second conductive contacts 124 are formed in the barrier layer 110, the source region 108 and the drain region 106. Formation of the first conductive contact 122 and the second conductive contacts 124 may include etching openings in the second insulating layer 118, the barrier layer 110, the source region 108 and the drain region 106, filling one or more conductive materials in the openings and then planarizing the conductive materials using a planarization process. The first conductive contact 122 can be referred to as a bit line contact. The second conductive contacts 124 can be referred to as storage node contacts. The second conductive contacts 124 are coupled to the corresponding source region 108 and the drain region 106.

A dielectric layer 126 is formed on the barrier layer 110, the second insulating layer 118, covering the first conductive contact 122 and the second conductive contacts 124. In some embodiments, the dielectric layer 126 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The dielectric layer 126 may be formed by deposition processes such as chemical vapor deposition, plasma-enhanced chemical vapor deposition, or the like.

A plurality of capacitor structures 128 may be formed in the dielectric layer 126 and on the second conductive contacts 124. The capacitor structures 128 include a bottom electrode 130, a dielectric layer 132 surrounding the bottom electrode 130, and a top electrode 134 covering the dielectric layer 132. In some embodiments, the bottom electrode 130 may be in a column-shaped and extend upward from the substrate 100. The bottom electrode 130 and the top electrode 134 may be made of polysilicon, or other suitable conductive materials. In some embodiments, the dielectric layer 132 includes silicon oxide, tungsten oxide, copper oxide, aluminum oxide, hafnium oxide, or the like. In some embodiments, the dielectric layer 132 may be formed by chemical vapor deposition (CVD), atomic layer deposition (ALD), or other suitable methods.

In some embodiments, the semiconductor device 10 includes other layers or features not specifically illustrated. In some embodiments, additional back end of line (BEOL) processes may be performed on the semiconductor device 10.

Figure 8B:
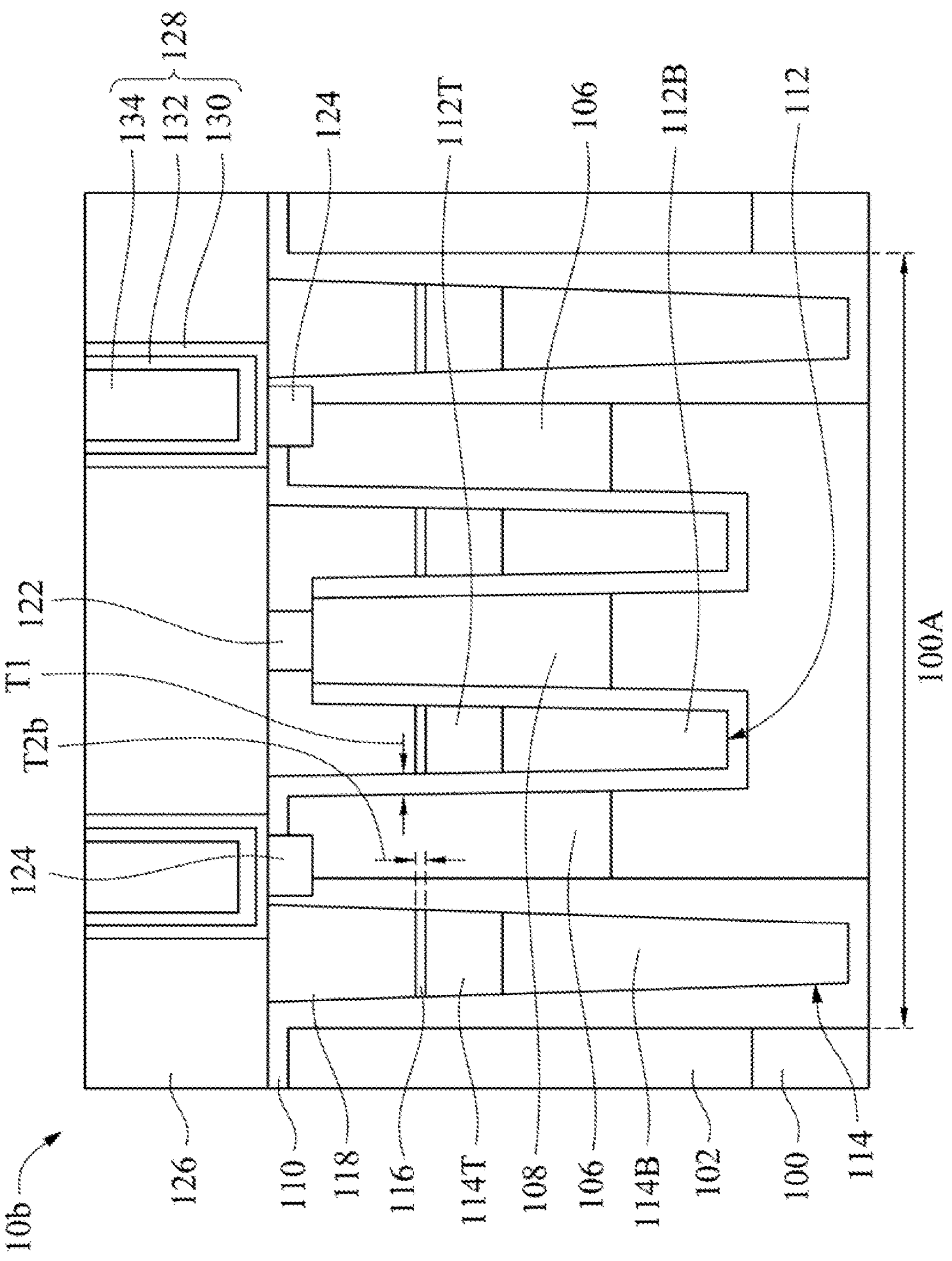
Figure 8C:
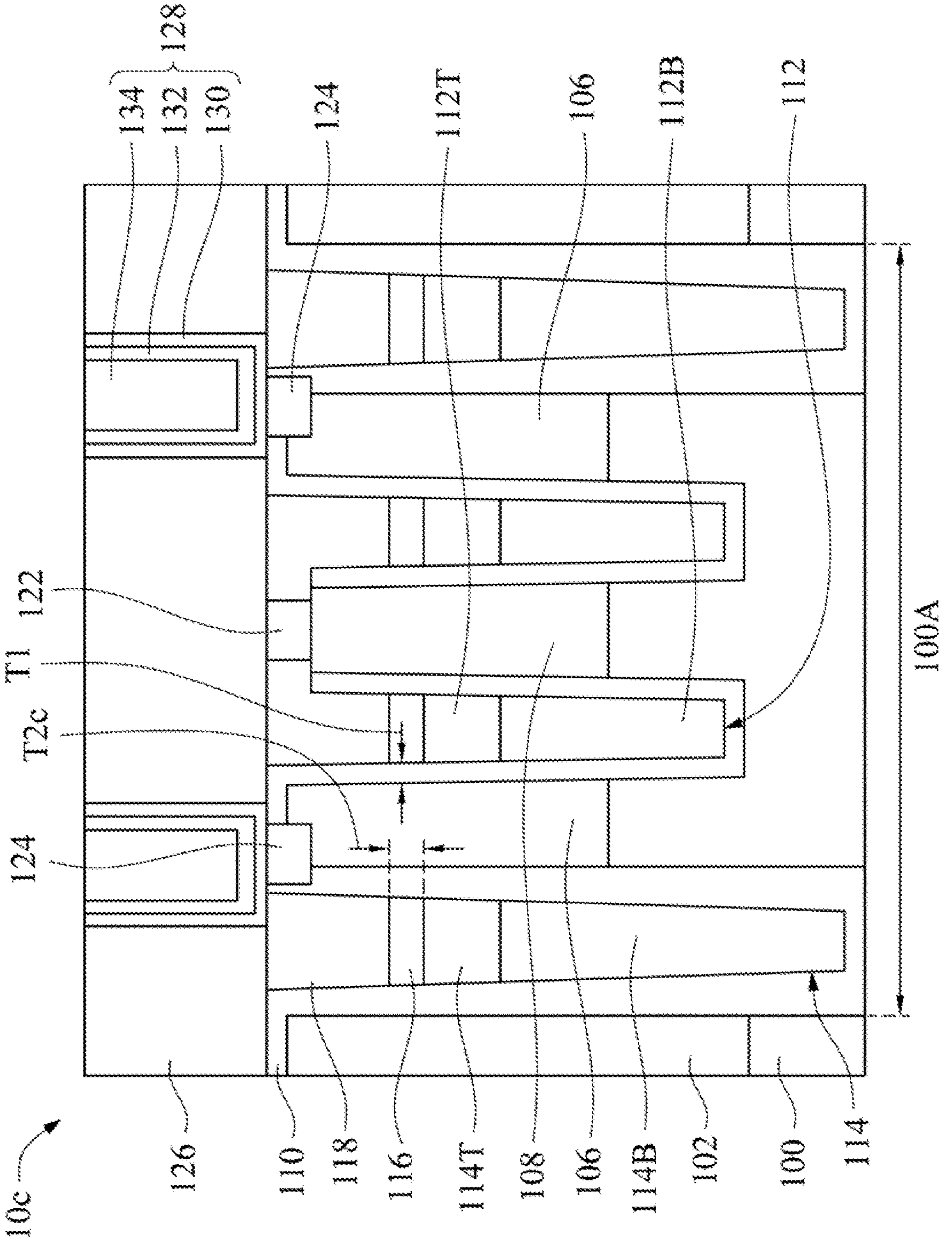
Figure 8D:
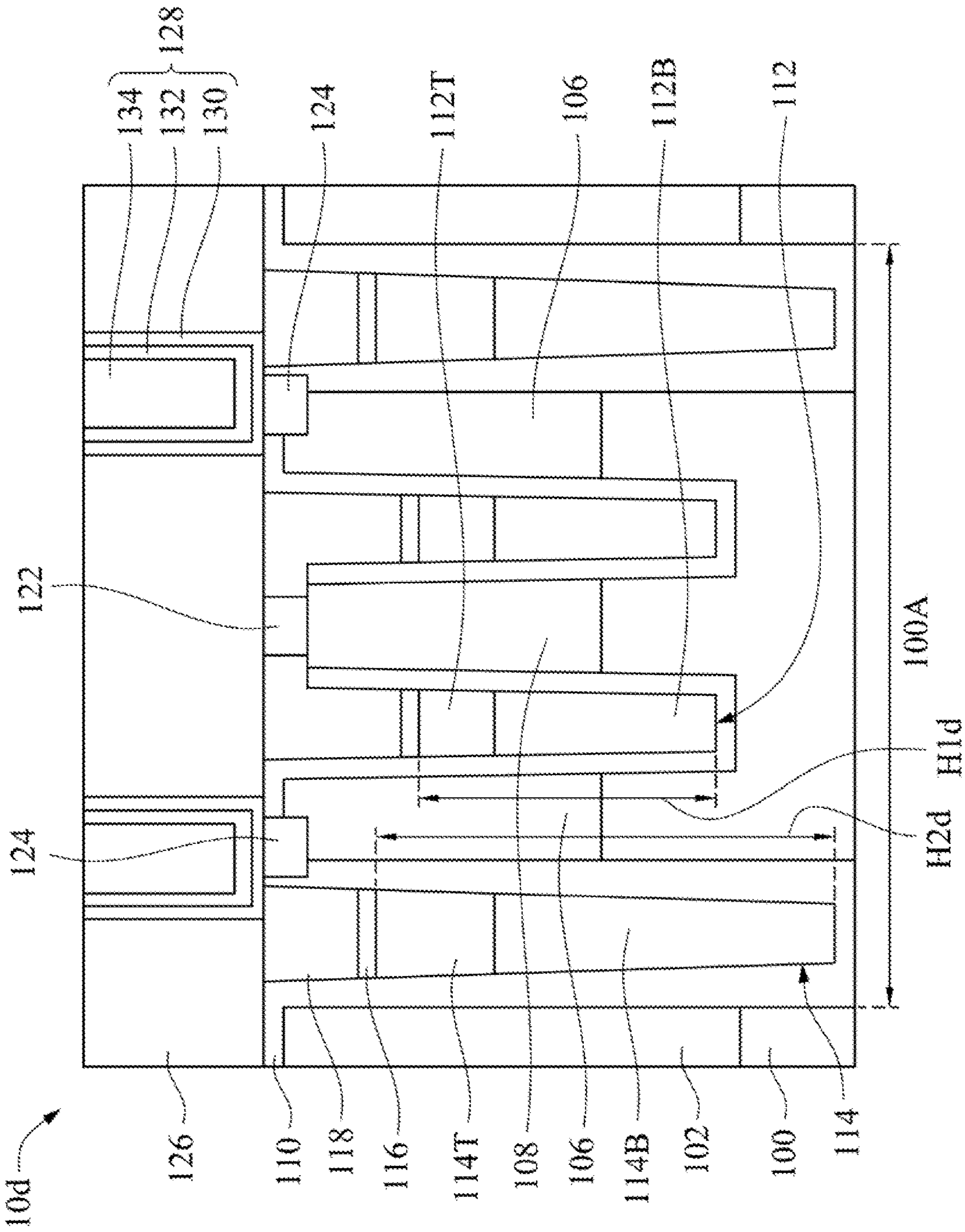

In FIG. 8A, the first insulating layer 116 has the thickness T2 substantially the same as the thickness T1 of the barrier layer 110. FIGS. 8B, 8C and 8D are cross-sectional views of a semiconductor device 10*b*, a semiconductor device 10*c* and a semiconductor device 10*d* in accordance with other embodiments of the present disclosure. The main difference between the semiconductor device 10*b* and the semiconductor device 10 in FIG. 8A is that the semiconductor device 10*b* includes the first insulating layer 116 with the thickness T2*b* less than the thickness T1 of the barrier layer 110. The main difference between the semiconductor device 10*c* and the semiconductor device 10 in FIG. 8A is that the semiconductor device 10*c* includes the first insulating layer 116 with the thickness T2*c* greater than the thickness T1 of the barrier layer 110.

The main difference between the semiconductor device 10*d* and the semiconductor device 10 in FIG. 8A is that the semiconductor device 10*d* includes the second word lines 114 has the height H2*d* greater than the height H1*d* of the first word lines 112. Therefore, the first insulating layer 116 on the second word lines 114 is at a higher position than the first insulating layer 116 on the first word lines 112 is. In other words, the first insulating layer 116 on the second word lines 114 has a top surface higher than a top surface of the first insulating layer 116 on the first word lines 112. The first insulating layer 116 can prevent the GIDL of the semiconductor device 10*d* from increasing caused by a high electrical field shift near the top portions 114T of the second word lines 114 due to the abnormal height H2 of the top portions 114T.

Figure 8E:
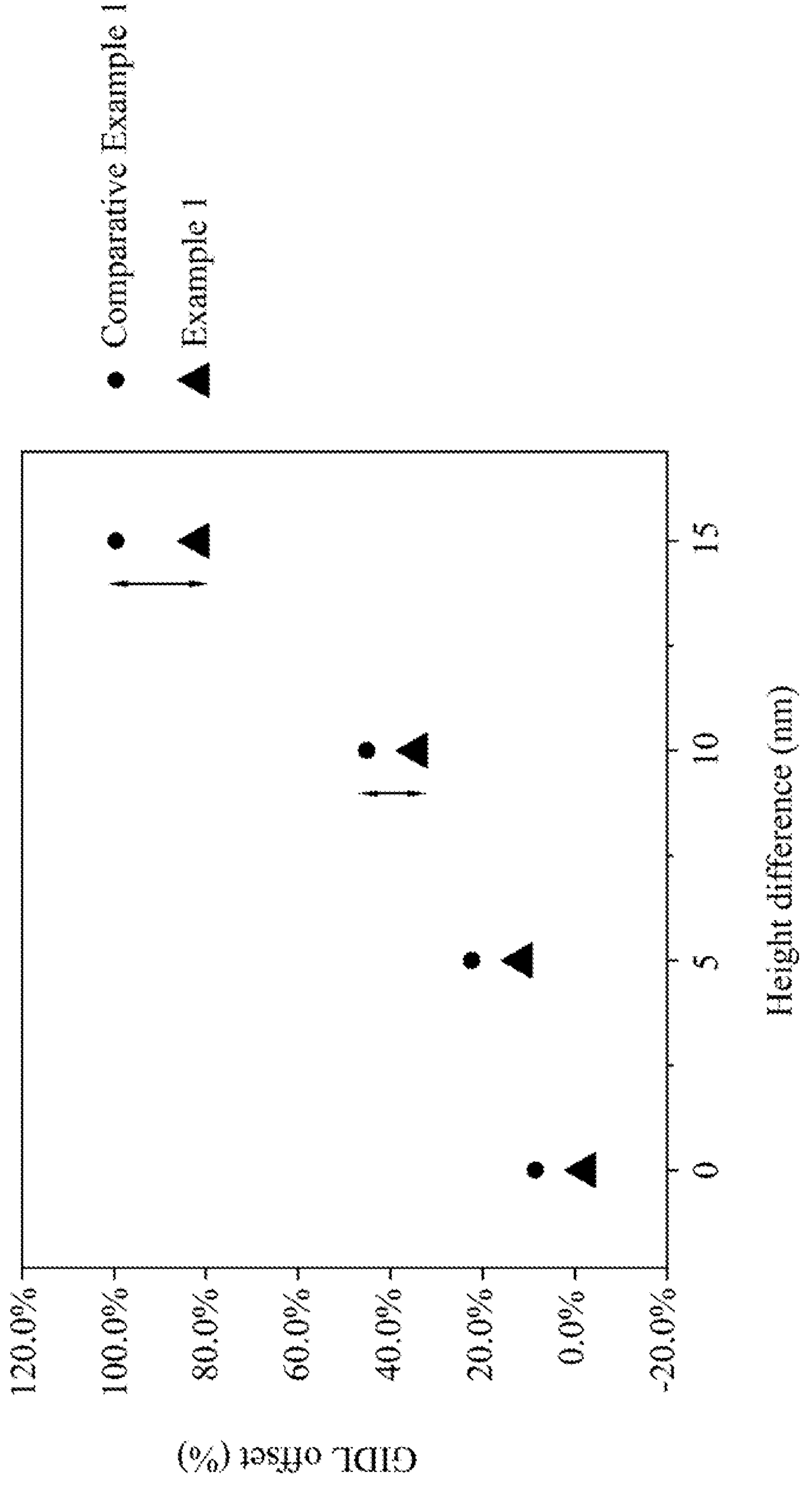
FIG. 8E is a graph showing a gate induced drain leakage (GIDL) versus a height difference between the top portion of the first word line and the top portion of the second word line.

FIG. 8E is a graph showing a gate induced drain leakage (GIDL) versus a height difference between the top portion 112T of the first word line 112 and the top portion 114T of the second word line 114. Reference is made to FIGS. 8D and 8E. A comparative example 1 has a structure similar to a structure of the semiconductor device 10*d* of an example 1. For example, the comparative example does not include the first insulating layer 116. When the height difference (i.e., height H2–height H1) is about 8 nm to about 12 nm, such as about 10 nm, the GIDL of the Comparative Example 1 has an increased amount of about 35% to about 45%, such as higher than 40%. In the Example 1, which includes the first insulating layer 116, the GIDL degradation caused by the height difference between the top portions 112T of the first word line 112 and the second word line 114 can be mitigated.

Figure 9:
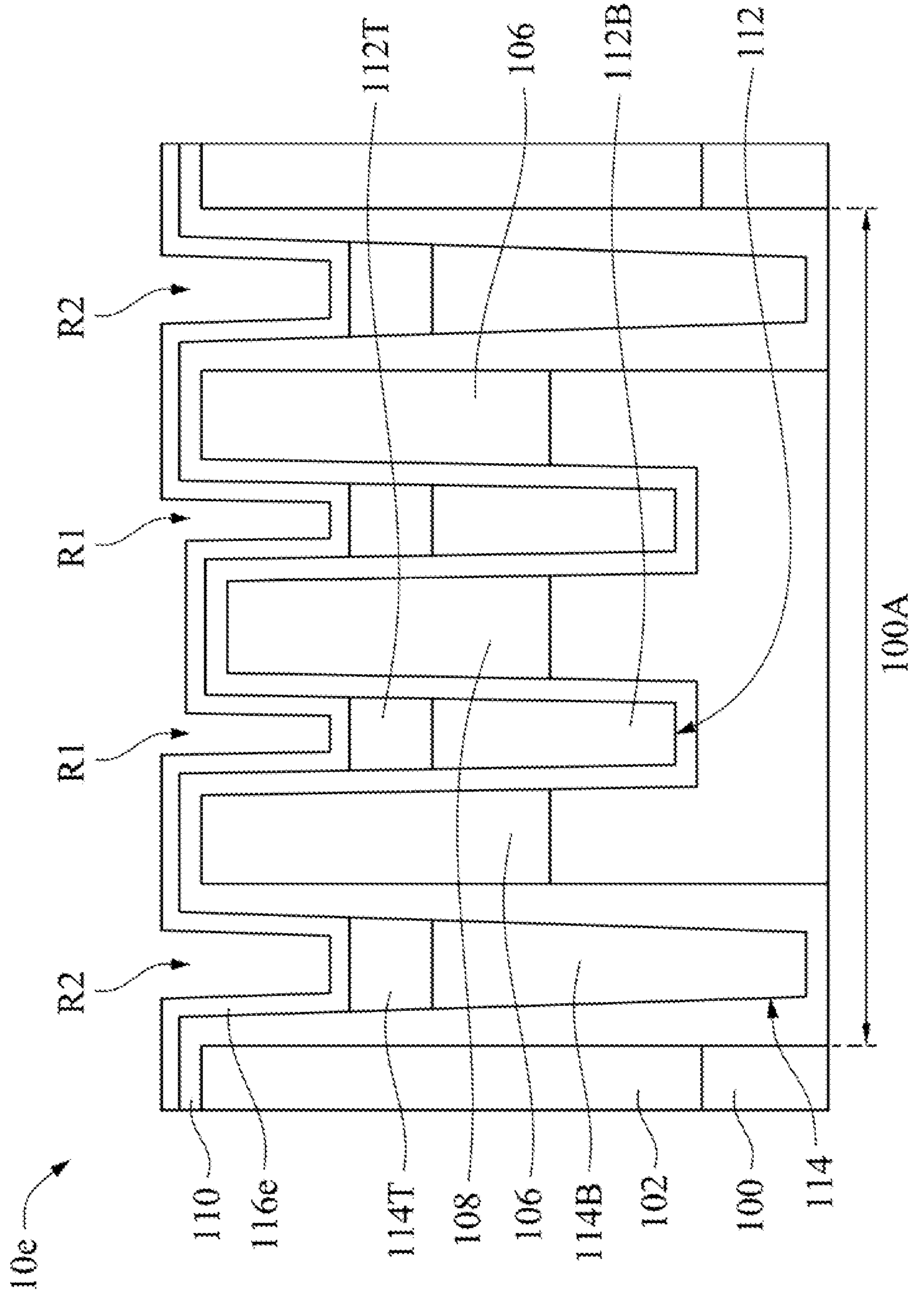
FIGS. 9, 10, and 11 are cross-sectional views of a semiconductor device in accordance with some embodiments of the present disclosure.
Figure 10:
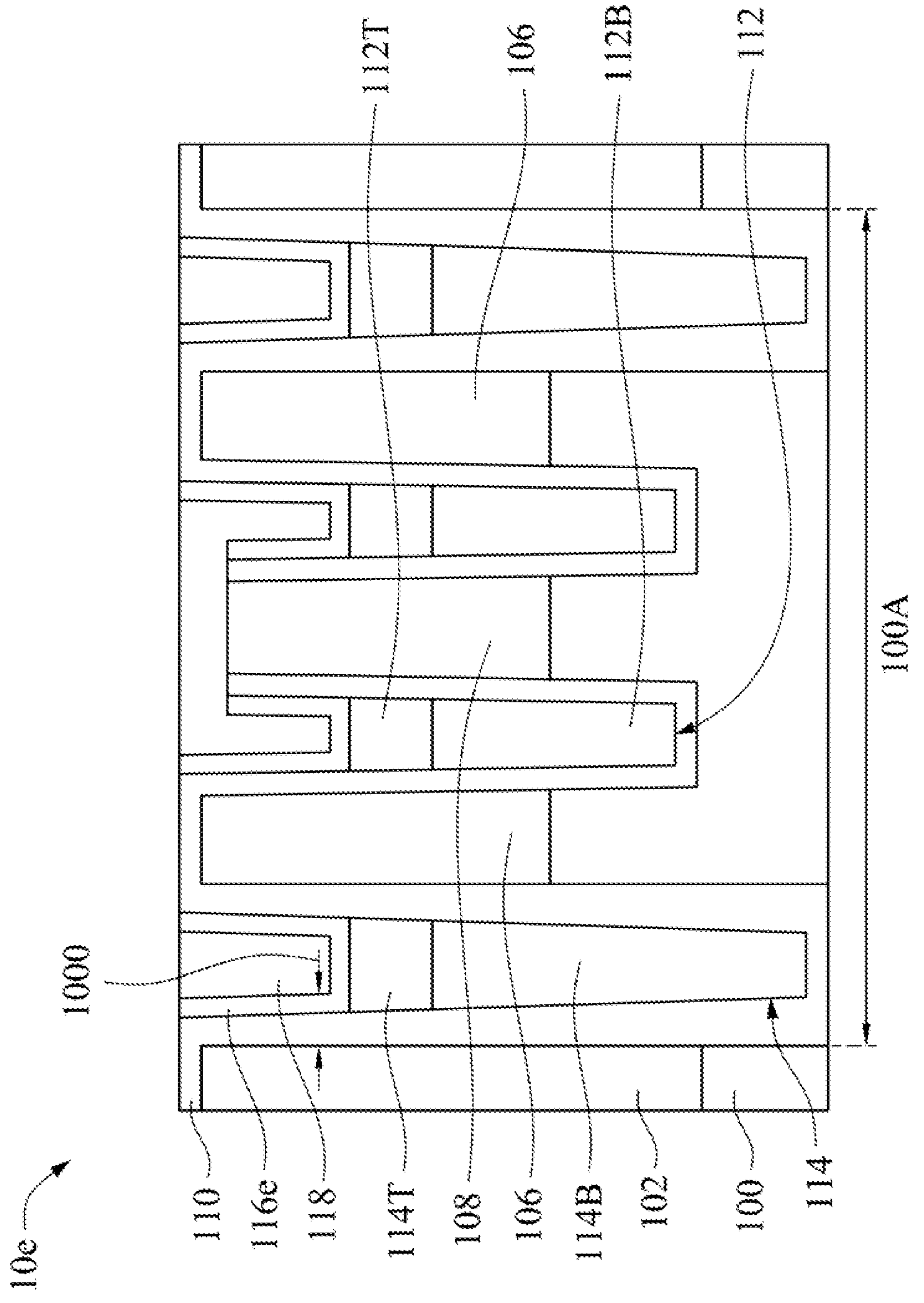
Figure 11:
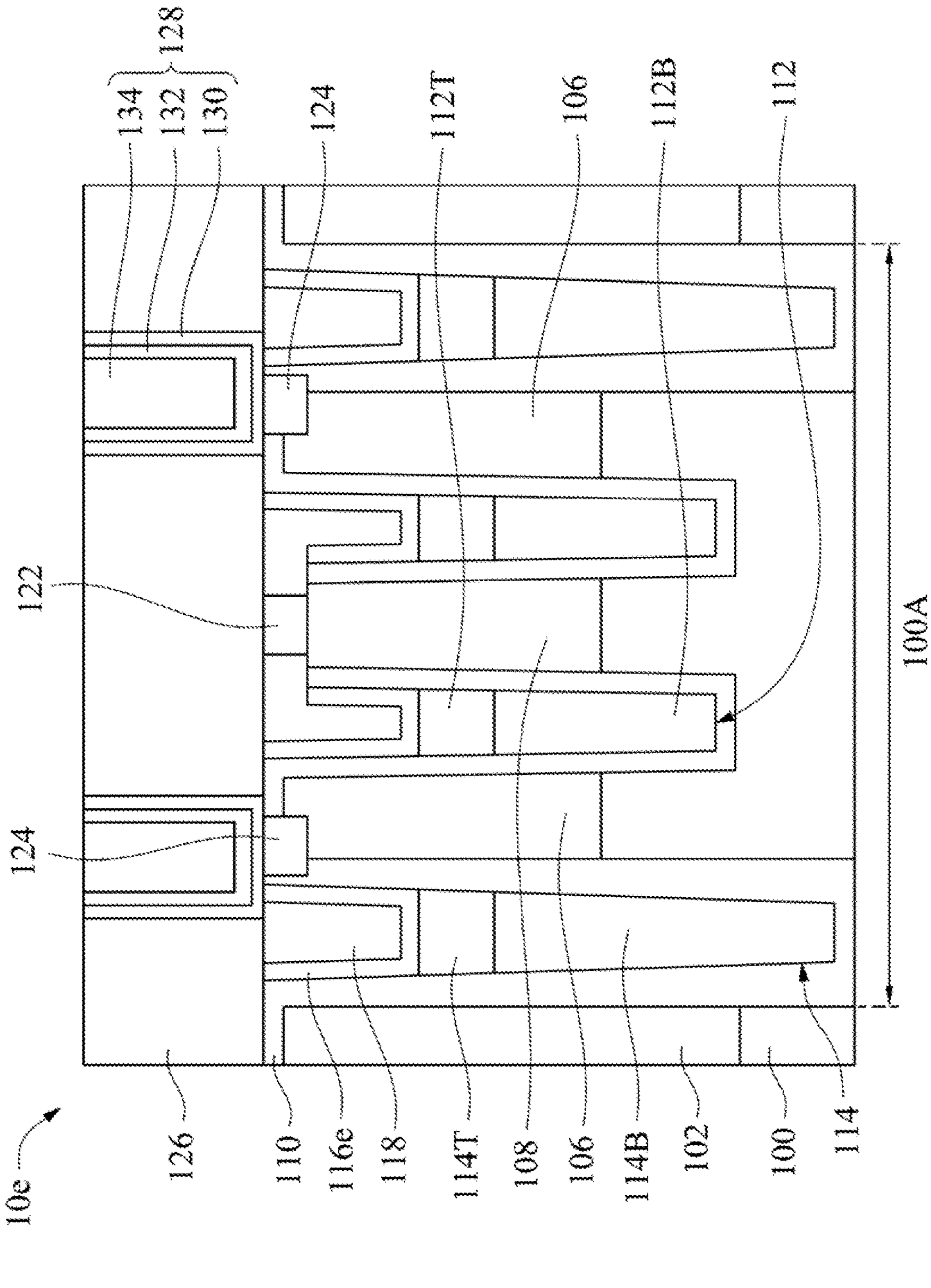

FIGS. 9-11 are cross-sectional views of a method of forming a semiconductor device 10*e* at various stages in accordance with some embodiments of the present disclosure. The main difference between the semiconductor device 10*e* and the semiconductor device 10 in FIG. 7 is that the semiconductor device 10*e* includes the first insulating layer 116*e* formed using ALD process. The ALD process is performed to form the first insulating layer 116*e* such that the first insulating layer 116*e* extends along opposite inner sidewalls of the barrier layer 110. In FIG. 9, the first insulating layer 116*e* is conformally formed over the barrier layer 110 in the recess R1 and the recess R2. In greater details, the first insulating layer 116*e* has a horizontal portion over the top portions 112T of the first word lines 112, a horizontal portion over the top surface of the barrier layer 110, and a side portion along sidewalls of the recesses R1, R2. The first insulating layer 116*e* extends along an inner sidewall of the barrier layer 110. Due to the presence of the side portion of the first insulating layer 116*e*, the subsequently formed second insulating layer 118 and the isolation region 102 can be separated by an increased distance 1000 along a horizontal direction (see FIG. 10).

In FIG. 10, a second insulating layer 118 is formed on the first insulating layer 116*e*. The second insulating layer 118 is then planarized, for example, by a planarization such as a CMP process. In some embodiments, the second insulating layer 118 and the first insulating layer 116*e* have an etch selectivity. For example, the second insulating layer 118 and the first insulating layer 116*e* include different materials. In some embodiments, the second insulating layer 118 includes nitride, such as silicon nitride, and the first insulating layer 116*e* includes oxide, such as silicon oxide. The first insulating layer 116*e* can be utilized to control an end point during the planarization process. After the planarization process is performed, the barrier layer 110 is exposed. The first insulating layer 116*e* has a U-shape in a cross section. The first insulating layer 116*e* cups an underside of the second insulating layer 118. The first insulating layer 116*e* surrounds the second insulating layer 118.

Referring to FIG. 11, the first conductive contact 122, the second conductive contacts 124, the dielectric layer 126 and the capacitor structures 128 are formed on the substrate 100, as discussed previously with regard to FIG. 8A, and thus the description thereof is omitted herein for clarity. In some embodiments, the semiconductor device 10*d* includes other layers or features not specifically illustrated. In some embodiments, additional back end of line (BEOL) processes may be performed on the semiconductor device 10*e*.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:

a substrate;

a first word line in the substrate;

a second word line in the substrate;

a barrier layer cupping an underside of each of the first word line and the second word line;

a first insulating layer extending along a top surface of the first word line and a top surface of the second word line, wherein the first insulating layer is laterally surrounded by the barrier layer, and wherein the first insulating layer on the second word line has a top surface higher than a top surface of the first insulating layer on the first word line; and a second insulating layer on the first insulating layer and laterally surrounded by the barrier layer, wherein the second insulating layer has a material different from a material of the first insulating layer.

2. The semiconductor device of claim 1, wherein the first insulating layer has a thickness the same as a thickness of the barrier layer.

3. The semiconductor device of claim 1, wherein the first insulating layer has a thickness greater than a thickness of the barrier layer.

4. The semiconductor device of claim 1, wherein the barrier layer and the first insulating layer include a same material.

5. The semiconductor device of claim 1, wherein the second word line has a height different from a height of the first word line.

6. The semiconductor device of claim 1, wherein the first insulating layer has a thickness less than a thickness of the barrier layer.

7. The semiconductor device of claim 1, wherein the barrier layer comprises silicon oxide.

8. The semiconductor device of claim 1, wherein the second insulating layer comprises silicon nitride.

9. The semiconductor device of claim 1, wherein the first insulating layer comprises silicon oxide.

* * * * *